(12) United States Patent
Sakai

(10) Patent No.: US 7,940,071 B2
(45) Date of Patent: May 10, 2011

(54) SEMICONDUCTOR DEVICE AND A METHOD OF TESTING THE SAME

(75) Inventor: Shingo Sakai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1212 days.

(21) Appl. No.: 11/580,069

(22) Filed: Oct. 13, 2006

(65) Prior Publication Data

US 2007/0091701 A1    Apr. 26, 2007

(30) Foreign Application Priority Data

Oct. 14, 2005    (JP) .................................. 2005-300151

(51) Int. Cl.
  *G01R 31/26*    (2006.01)
  *G01R 31/02*    (2006.01)
(52) U.S. Cl. .................... 324/762.01; 324/537
(58) Field of Classification Search .................. 324/537, 324/500, 765, 762.01
  See application file for complete search history.

(56) References Cited

U.S. PATENT DOCUMENTS

| 6,247,138 B1 | 6/2001 | Tamura et al. |
| 6,281,723 B1 * | 8/2001 | Tailliet ........................... 327/143 |
| 6,323,668 B1 * | 11/2001 | Hashimoto .................... 324/763 |
| 6,348,826 B1 | 2/2002 | Mooney et al. |
| 6,397,042 B1 | 5/2002 | Prentice et al. |
| 7,227,351 B2 * | 6/2007 | Kim et al. ................... 324/158.1 |
| 7,309,998 B2 * | 12/2007 | Burns et al. ..................... 324/765 |
| 2005/0201500 A1 | 9/2005 | Shizuki |
| 2007/0208526 A1 * | 9/2007 | Staudt et al. .................. 702/117 |

FOREIGN PATENT DOCUMENTS

| JP | 8-179009 A | 7/1996 |
| JP | 11-261408 A | 9/1999 |

* cited by examiner

*Primary Examiner* — Hoai-An D Nguyen
(74) *Attorney, Agent, or Firm* — Sughrue Mion, PLLC

(57) ABSTRACT

A semiconductor device is provided. The semiconductor devices includes a first and second differential pair to which first and second differential input signals are input. The first and second differential pairs are connected to N (N is an integer greater than 1) current sources through N switch pairs. Switches on one side of said N switch pairs are each connected at one end thereof to one of the N current sources and each of the switches on the one side of said N switch pairs are commonly connected at the other end thereof to the first or the second differential pairs. Control signals are connected to control terminals of said N switch pairs, so that a pattern is applied to the N switch pairs. The operation of the current sources can be confirmed by a functional test based on output values from the first and second differential pairs.

10 Claims, 6 Drawing Sheets

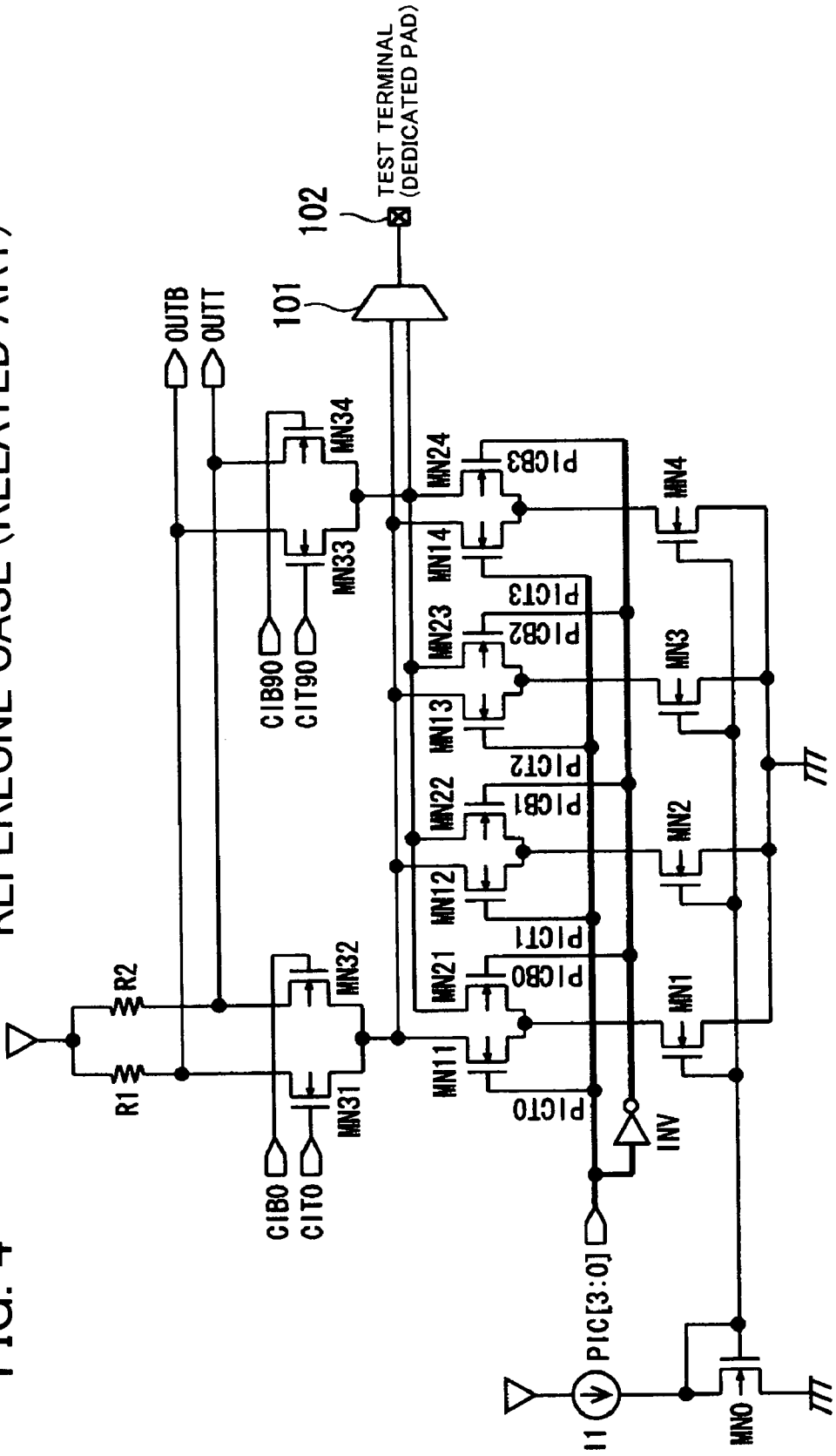
FIG. 4 REFERECNE CASE (RELATED ART)

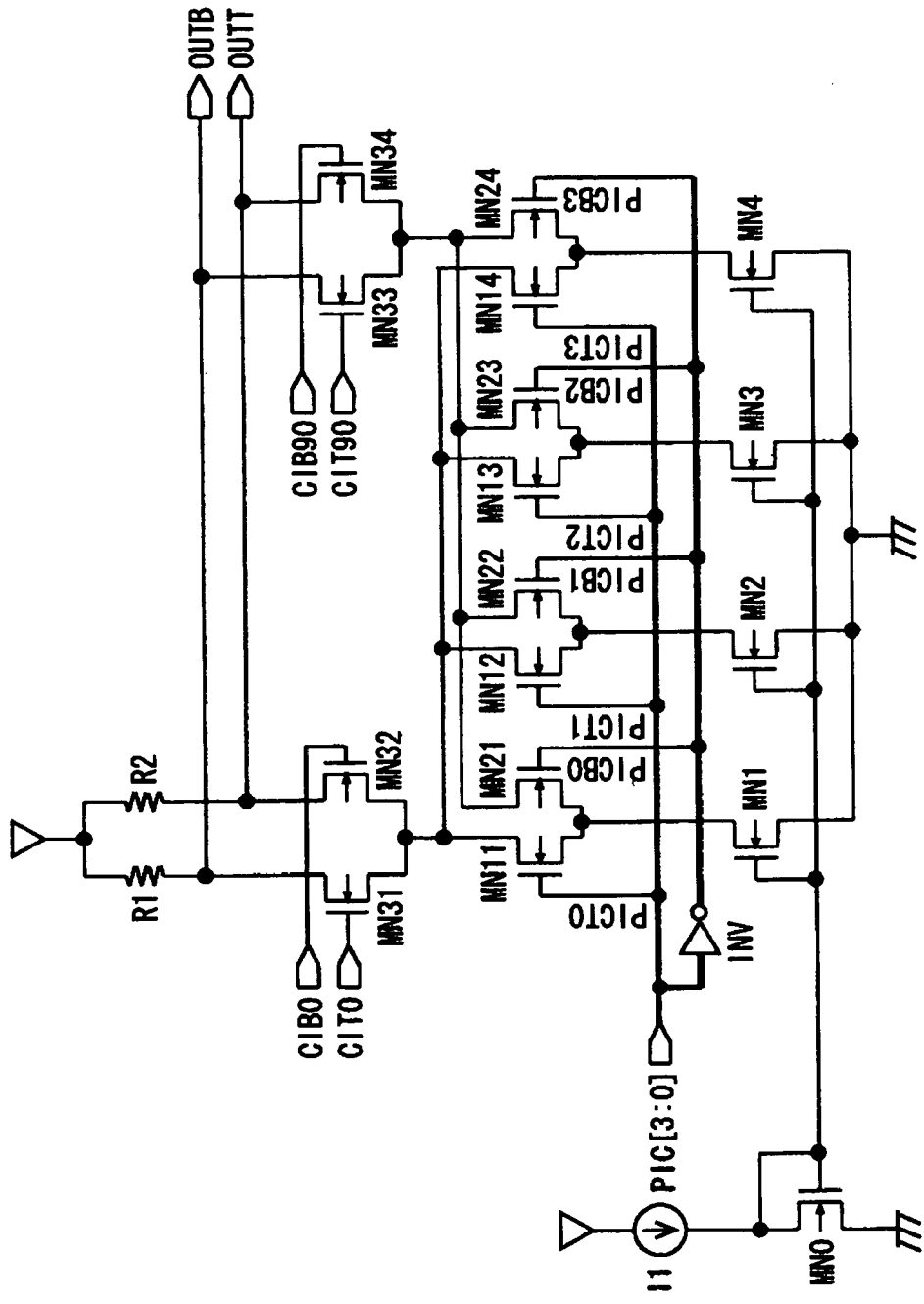
FIG. 6 REFERENCE CASE (RELATED ART)

SEMICONDUCTOR DEVICE AND A METHOD OF TESTING THE SAME

FIELD OF THE INVENTION

The present invention relates to a semiconductor device and in particular to an apparatus having a configuration which is preferable for testing said semiconductor device and a method for testing the same.

BACKGROUND OF THE INVENTION

An exemplary structure of typical phase interpolator is shown in FIG. 6. The phase interpolator is adapted to output in response to a control signal, output signals each having a phase corresponding to any of phases which are obtained by dividing the difference in phase between two input signals. A configuration is shown in FIG. 6 in which the phase difference between two input signals is divided into four regions, so that output signals corresponding to any of phases are output in response to a control signal.

Referring now to FIG. 6, the phase interpolator comprises a first differential pair of transistors (NMOS transistor pair MN31, MN32) to which first differential input signals (phase 0°) (CIB 0, CIT 0) are input as differential inputs; and second differential transistor pair (NMOS transistor pair MN33, MN34) to which second differential input signals (phase 90°) (CIB 90, CIT 90) are input as differential inputs. The output pairs of the first transistor pair (MN31, MN32) and second transistor pair (MN33, MN34) are commonly connected to each other and are connected to load resistors (also referred to as "output resistors") (R1, R2) and are connected to differential terminals (OUTB, OUTT). The interpolator further comprises first to fourth current sources (NMOS transistors MN1 through MN4). The gates of the NMOS transistors MN1 through MN4 which constitute the first through fourth current sources are commonly connected to the gate of an NMOS transistor MN0 having its drain and gate which are connected to a constant current source I1 and its source which is grounded for forming a current mirror. In the foregoing description, the currents from the first through fourth current sources (MN1 through MN4) are mirror currents equal to a drain current of the NMOS transistor MN0. Weights may be assigned to the currents from the first through fourth current sources (MN1 through MN4). Although the first to fourth current sources (MN1 to MN4') are illustrated in FIG. 6, it is to be noted that the number of current sources is not limited to only 4.

The phase interpolator further comprises first to fourth switch pairs (MN11, MN21), (MN12, MN22), (MN13, MN23), (MN14, MN24), comprising NMOS transistor pairs having their sources which are connected to first through fourth current sources (MN1 through MN4). The transistors MN11, MN12, MN13, MN14 on one side of the first through fourth switch pairs have their drains which are commonly connected to common sources of the first differential pair (MN31, MN32). The transistors MN21, MN22, MN23 and MN24 on the other side of the first to fourth switch pairs have their drains which are commonly connected to the common sources of the second differential pairs (MN33, MN34).

Control signals (PICT0, PICT1, PICT2, PICT3) are connected to the gates of the transistors MN11, MN12, MN13, MN14 on the side of the first through fourth switch pairs, respectively. Control signals (PICB0, PICB1, PICB2, PICB3) which are obtained by inverting the control signals (PICT 0 through 3) by an inverter INV are connected to the gates of the transistors MN21, MN22, MN23, MN24 on the other side of the first through fourth switch pairs. The first through fourth switch pairs are controlled so that one switch of the switch pair is turned on while the other switch is turned off.

The phase differences between two differential input signals (CIT0, CIB0), (CIT90, CIB90) are divided by controlling turning on or off of the transistor pairs of the first through fourth switch pairs (MN11, MN21), (MN12, MN22), (MN13, MN23), (MN14, MN24) with a four-bit control signal PIC [3:1] (the control signals PICT0, PICT1, PICT2, PICT3 are denoted by PIC [3:0] in FIG. 6) (provided that one of pair transistors is turned on when the other transistor is turned off) to change drive currents for first and second differential pairs (MN31, MN32), (MN33, MN34).

For example, when (PICT0, PICT1, PICT2, PICT3)=(1, 1, 1, 1), thus (PICB0, PICB1, PICB2, PICB3)=(0, 0, 0, 0), a drive current (a sum of the currents from the current sources MN1, MN2, MN3, MN4) is supplied to only common sources of the first differential pair (MN31, MN32), so that the differential output signal having a phase corresponding to the differential input signals (CIT0, CIB0) is output. When (PICB0, PICB1, PICB2, PICB3)=(1, 1, 1, 1), (PICT0, PICT1, PICT2, PICT3)=(0, 0, 0, 0), a drive current (a sum of currents from the current sources MN1, MN2, MN3, MN4) is supplied to only common sources of the second differential pair (MN33, MN34), so that the differential output signal having a phase corresponding to the differential input signals (CIT90, CIB90) having a phase difference of 90° is output. In case of other combination of control signals PICs [3:0], the differential output signal corresponding to a phase which is obtained by dividing the phase difference between the differential input signals (CIT0, CIB0) and (CIT90, CIB90) is output.

That is, output signals which are phase-out-of 22.5° are generated by inputting input signals of 0° and 90° and by variably controlling the weights assigned to four current sources (MN1, MN2, MN3, MN4). For example, by letting (PICT0, PICT1, PICT2, PICT3)=(1,0,0,0) and (PICB0, PICB1, PICB2, PICB3)=(0, 1, 1, 1), the common sources of the first differential transistor pair (MN31, MN32) are connected to the current source MN1 through a transistor MN11 which is turned on and the common sources of the second transistor pair (MN33, MN34) are connected to the current sources MN2, MN3, MN4 through the transistors MN22, MN23, MN24 which are turned on. Therefore, the ratio of a drive current (a current from the current source MN1) of the first differential transistor pair (MN31, MN32) to which a 0° clock is input to a drive current (a sum of the currents from the current sources MN2, MN3, MN4) of the second differential transistor pair (MN33, MN34) to which 90° clock is input is 1:3. A clock of 67.5° which is obtained by proportionally dividing an angle between 0° and 90° at a ratio of 1:3 is output.

In such a manner, current paths through a plurality of current sources are normally turned on in the phase interpolator during usual operation. (The MNOS transistors on one side of the first to fourth switch pairs are turned on while the others are turned off). No determination whether individual transistors constituting current sources are turned on or off can be made. In other words, operation of each one of a plurality of current sources can not be confirmed, individually.

SUMMARY OF THE DISCLOSURE

Hence, a circuit configuration as shown in, for example, FIG. 4 is assumed as configuration to confirm the operation of the phase interpolator shown in FIG. 6. FIG. 4 shows a comparative example which is compared with the present invention and is drawn by the present inventors for comparison therebetween. Referring now to FIG. 4, a common source node of the first differential transistor pair (MN31, MN32) (common drain of the transistors MN11, MN12, MN13, MN14 of the first to fourth switch pairs) are connected to a first input terminal of a selector 101 and a common source node of the second differential transistor pair (MN33, MN34) (common drain of the transistors MN21, MN22, MN23, MN24 of the first to fourth switch pairs) is connected to a second input terminal of the selector 101, so that a signal line which is selected by the selector 101 is connected to a test terminal 102. If a path between, for example, the current source MN1 and the transistor MN11 is to be tested in a circuit configuration shown in FIG. 4, a current flowing through a test terminal 102 is measured by a current meter (current measuring circuit for test) by letting, for example, (PICT0, PICT1, PICT2, PICT3)=(1, 0, 0, 0) and selecting a common source node of the first differential pair (MN31, MN32) by the selector 101. When the current is measured, the differential input signals (CIT0, CIB0) are made (0, 0), and both of the transistors MN31, MN32 of the first differential pair are turned off. When a path between the current source MN1 and the transistor MN21 is to be tested, (PICB0, PICB1, PICB2, PICB3) is made (1, 0, 0, 0), thus PIC [3:0]=0111, the common source node of the second differential pair (MN33, MN34) is selected by the selector 101 and a current flowing through the test terminal 102 is measured by a current meter (the current measuring circuit for test). The same is applied to the tests of other current sources MN2 to MN4.

In case of the configuration shown in FIG. 4, a pad 102 which is dedicated to the test terminal is necessary, which increases the circuit area. Since the other pad can not be commonly used for measuring the current in testing the circuit, a dedicated pad is necessary.

Further, an extended period of time is taken to conduct test since it is necessary to select any one of the current sources to be tested with a control signal PIC and to extract a signal for test (i.e., a current from the selected current source). An extended period of time is also taken to conduct DC measurement such as current measurement. This further extends the testing time. As a result, an increase in the test cost is introduced and reduction in the product cost becomes more difficult.

In order to solve the above-mentioned problem, the invention which is disclosed herein is generally configured as follows.

In one aspect of the present invention, there is provided a semiconductor device in which each of a plurality of current paths comprises a plurality of switching elements which control turning on or off of a current in response to input digital signals, so that a signal or signals corresponding to a sum of currents flowing through the turned-on current paths is/are output from an output terminal or terminals, characterized in that the plurality of switching elements are controllable to turn on or off independently of each other in response to the input digital signals, and during testing, operation of the current paths can be confirmed by a functional test through controlling turning-on or off of the switching elements with the input digital signals to output logical signals from the output terminal or terminals and comparing the logical signals with expected value to determine matching therebetween.

In another aspect of the present invention, there is provided a semiconductor device characterized in that the device comprises: a first differential pair to which a first input signal or signals is/are input as a differential input; a second differential pair to which a second input signal or signals is/are input as a differential input; a load circuit; a first to N-th (N is a positive integer larger than one) current sources; and a first to N-th switch pairs, each having a pair of switches; wherein output pair of each of said first and second differential pairs are commonly connected to each other at one end and are connected at the other end to said load circuit, at least one of said commonly connected output pairs being connected to an output terminal or terminals; the switches on one side of said first to N-th switch pairs are connected at one end thereof to said first to N-th current sources, respectively, and are commonly connected at the other end thereof to said first differential pair; the switches on the other side of said first to N-th switch pairs are connected at one end thereof to said first to N-th current sources, respectively, and are commonly connected at the other end thereof to said second differential pair; and 2N control signals having values which can be individually presettable are supplied to control terminals of said first to N-th switch pairs.

In a further aspect of the present invention, on, test of the above-mentioned semiconductor device, a method comprises a functional test step at which an application pattern is applied to control terminals of the first to N-th switch pairs from a test device on test by the 2N control signals, to determine whether the output signals from the output terminals match with expected value or values, and operation of at least one of the current sources, the first and second differential pairs and the first to N-th switch pairs to be tested can be confirmed by the functional test.

In further aspect of the present invention, there is provided a semiconductor device characterized in that the device comprises a plurality of current sources which are controlled to turn on or off in response to input digital signals and have their outputs which are commonly connected to each other; a resistor and switch element which are in series connected between the commonly connected outputs of the plurality of current sources and a first power source; and a logical circuit to which a test control signal for controlling test/normal modes of operation and the input digital signal are input to control the turning-on or off of the switch; wherein the commonly connected outputs of the plurality of current sources are connected to an output terminal; on testing the logical circuit controls the turning-on or off of the switch element in response to a value of the input digital signal to output a signal having a logical level as an output signal, so that operation of the current sources can be confirmed by a functional test.

In the present invention, each of the plurality of current sources comprises a serial circuit of a switch which is turned on or off in response to the input digital signal and a constant current source between the output terminal and a second power supply. In the present invention, in normal operation, the logical circuit turns the switch on, so that a signal (analogue signal) having a level corresponding to the input digital signal is output from the output terminal.

The meritorious effects of the present invention are summarized as follows.

In accordance with the present invention, it is possible to speed-up the test.

In accordance with the present invention, the necessity of dedicated test pad is eliminated, the circuit area is increased and the cost for testing is reduced.

BRIEF DESCRIPTION OF THE DRAWINGS

FIG. 4 is a view showing a comparative example of a test circuit of a phase interpolator.

FIG. 6 is a view showing the configuration of a typical phase interpolator.

PREFERRED EMBODIMENTS OF THE INVENTION

Figure 1:
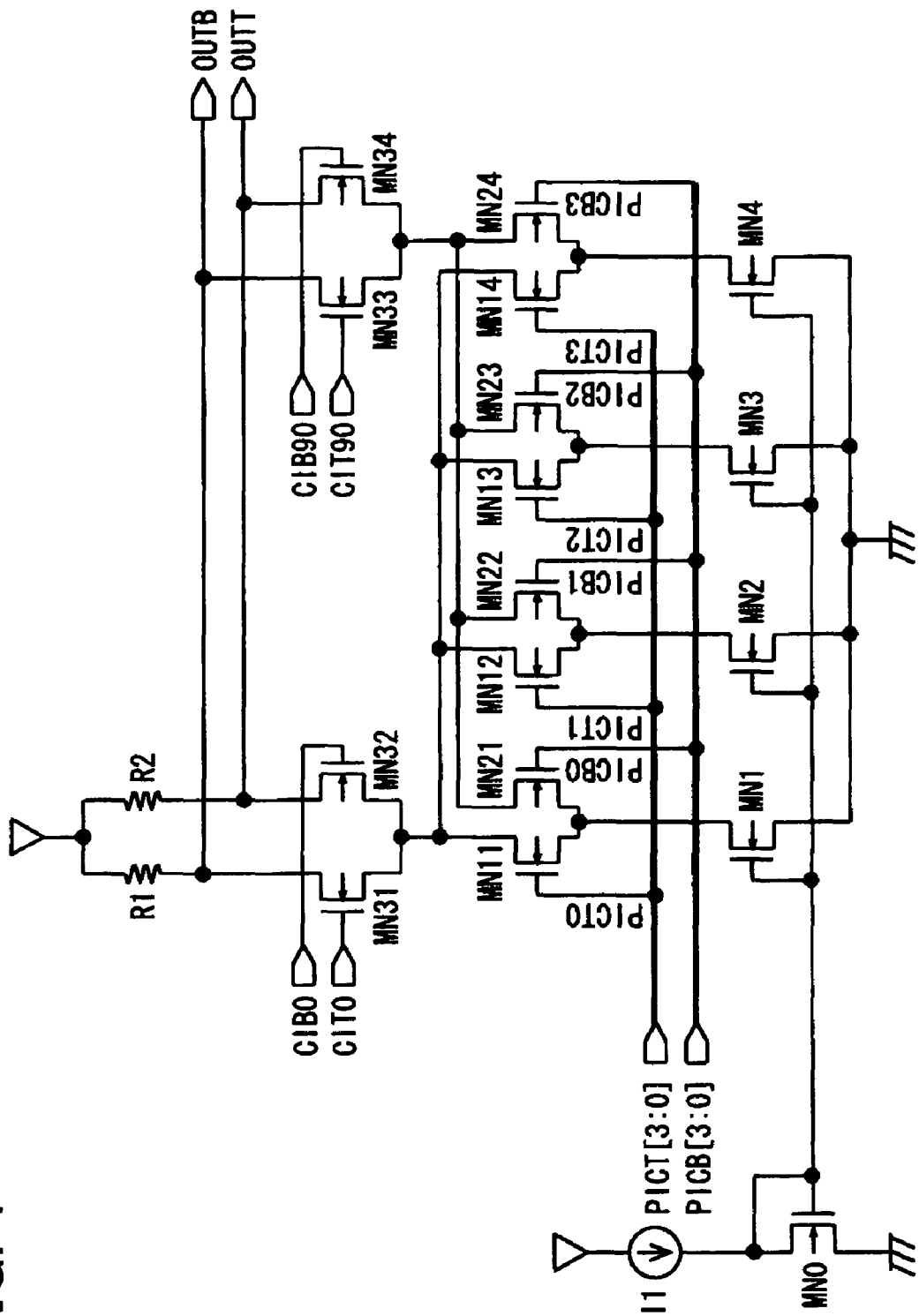
FIG. 1 is a view showing an example of the connection configuration of one embodiment of the present invention.

The above-mentioned present invention will now be described in detail with reference to annexed drawings: FIG. 1 is a view showing the configuration of one embodiment of the present invention. In FIG. 1, elements which are identical with those in FIG. 6 are denoted by identical references. Referring now to FIG. 1, in one embodiment of the present invention, control signals PCT0, PCT1, PCT2, PCT3 are connected to the gates of NMOS transistors MN11, MN12, MN13, MN14 of first to fourth switch pairs, respectively, and control signals PIC0, PIC1, PIC2, PIC3 are connected to the gates of other NMOS transistors MN21, MN22, MN23, MN24 of the first to fourth switch pairs, respectively. The NMOS transistors MN11, MN12, MN13, MN14; MN21, MN22, MN23, MN24 can be controlled with a four-bit control signal PICT [3:0] and four-bit control signal PICB [3:0], so that they are turned on or off, individually. Such a circuit configuration of the present invention obviates the necessity of dedicated pad for measuring a current as shown in FIG. 4.

In normal operation of one embodiment of the present invention, each bit of the control signal PICB [3:0] is supplied with each reversed bit of the control signal PICT [3:0]. The first to fourth switch pairs (MN1, MN21), (MN12, MN22), (MN13, MN23), (MN14, MN24) function as differential switches in each of which one of transistors of each switch pair is turned on when the other transistor is turned off as is similar to the case in FIG. 6.

Figure 2:
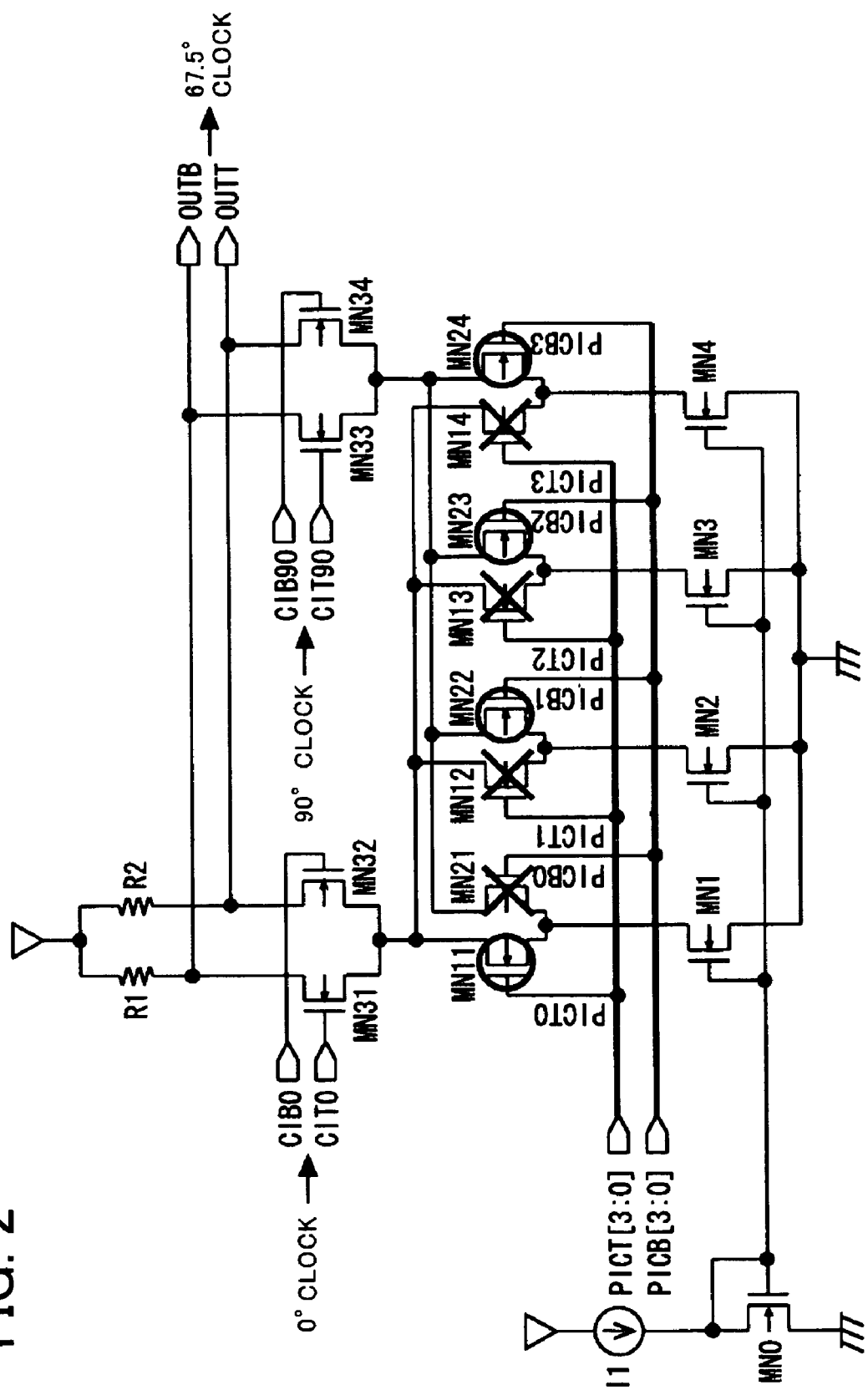
FIG. 2 is a view showing an example of the connection configuration of one embodiment of the present invention
Figure 3:
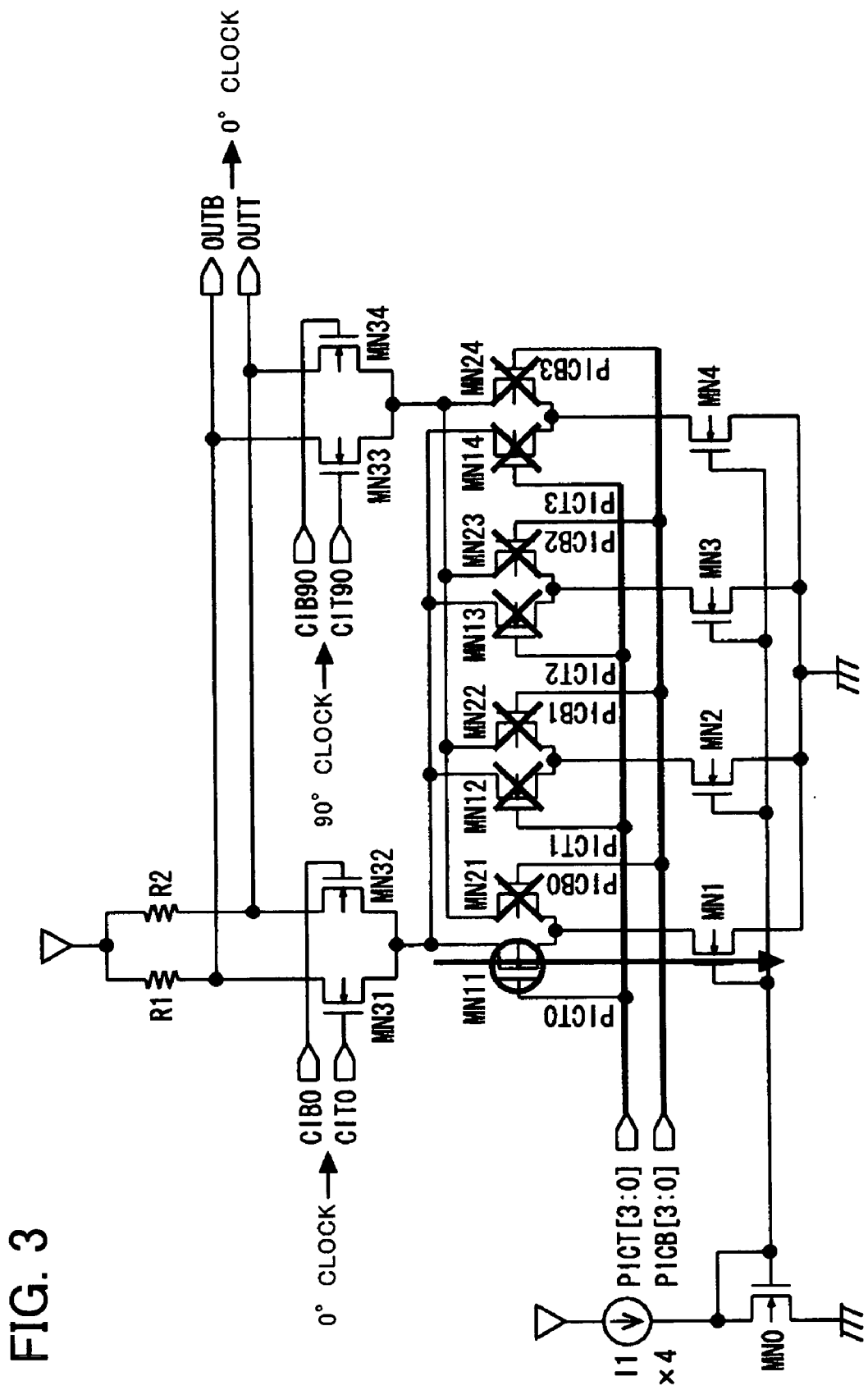
FIG. 3 is a view showing another example of the connection configuration of one embodiment of the present invention.

The ratio of the 0° clock to 90° clock (the ratio of currents) is made 1:3 and 67.5° clock is output (refer to FIG. 2) by letting, for example, (PICT0, PICT1, PICT2, PICT3)=(1, 0, 0, 0) and (PICB0, PICB1, PIB2, PICB3)=(0, 1, 1, 1,). Since a plurality of current sources are all normally turned on in the phase interpolator in such a manner that confirmation whether individual transistors which constitute current sources are turned on or off can not be conducted.

In contrast to this, the states which will be described below are brought by setting the control signal PICT [3:0] and the control signal PICB [3:0] on test, so that failure of the current sources and current paths can be detected. In a tester, pass/fail is determined by comparing either or both of the differential output signals OUTT, OUTB.

[1] When (PICT0, PICT1, PICT2, PICT3)=(1, 1, 1, 1) and PICB0, PICB1, PICB2, PICB3)=(0, 0, 0, 0), transistors MN11, MN12, MN13, MN14 are turned on while transistors MN21, MN22, MN23, MN24 are turned off, so that the first differential pair (MN31, MN32) is driven by the current sources MN1, MN2, MN3, MN4. Confirmation of the operation of the first differential pair (MN31, MN32) can be made by comparing the values of the differential output signals (OUTT, OUTB) with expected values.

[2] When (PICT0, PICT1, PICT2, PICT3)=(0, 0, 0, 0) and PICB0, PICB1, PICB2, PICB3)=(1, 1, 1, 1), transistors MN21, MN22, MN23, MN24 are turned on while transistors MN11, MN12, MN13, MN14 are turned off, so that the second differential pair (MN33, MN34) is driven by the current sources MN1, MN2, MN3, MN4. Confirmation of the operation of the second differential pair (MN31, MN32) can be made by comparing the values of the differential output signals (OUTT, OUTB) with expected values.

[3] When (PICT0, PICT1, PICT2, PICT3)=(1, 0, 0, 0) and (PICB0, PICB1, PICB2, PICB3)=(0, 0, 0, 0), the transistor MN11 of the first switch pair (MN11, MN21) is turned on while the other switches are all turned off. At this time, only the first differential pair (MN31, MN32) is supplied with a drive current. Confirmation of the operation of the current source MN1 and the transistor MN11 can be conducted by comparing the values of the differential output signals (OUTT, OUTB) with expected values. In other words, when the current source MN1 and/or transistor MN11 is/are defective, failure can be found by function test.

[4] When (PICT0, PICT1, PICT2, PICT3)=(0, 1, 0, 0) and (PICB0, PICB1, PICB2, PICB3)=(0, 0, 0, 0), the transistor MN12 of the second switch pair is turned on while the other switches are all turned off. At this time, only the first differential pair (MN31, MN32) is supplied with a drive current. Confirmation of the operation of the current source MN2 and the transistor MN12 can be conducted by comparing the values of the differential output signals (OUTT, OUTB) with expected values.

[5] When (PICT0, PICT1, PICT2, PICT3)=(0, 0, 1, 0) and (PICB0, PICB1, PICB2, PICB3)=(0, 0, 0, 0), the transistor MN13 of the third switch pair is turned on while the other switches are all turned off. At this time, only the first differential pair (MN31, MN32) is supplied with a drive current. Confirmation of the operation of the current source MN3 and the transistor MN13 can be conducted by comparing the values of the differential output signals (OUTT, OUTB) with expected values.

[6] When (PICT0, PICT1, PICT2, PICT3)=(0, 0, 0, 1) and (PICB0, PICB1, PICB2, PICB3)=(0, 0, 0, 0), the transistor MN14 of the fourth switch pair is turned on while the other switches are all turned off. At this time, only the first differential pair (MN31, MN32) is supplied with a drive current. Confirmation of the operation of the current source MN4 and the transistor MN14 can be conducted by comparing the values of the differential output signals (OUTT, OUTB) with expected values.

[7] When (PICT0, PICT1, PICT2, PICT3)=(0, 0, 0, 0) and (PICB0, PICB1, PICB2, PICB3)=(1, 0, 0, 0), the transistor MN21 of the first switch pair is turned on while the other switches are all turned off. At this time, only the second differential pair (MN33, MN34) is supplied with a drive current. Confirmation of the operation of the current source MN1 and the transistor MN21 can be conducted by comparing the values of the differential output signals (OUTT, OUTB) with expected values.

[8] When (PICT0, PICT1, PICT2, PICT3)=(0, 0, 0, 0) and (PICB0, PICB1, PICB2, PICB3)=(0, 1, 0, 0), the transistor MN22 of the second switch pair is turned on while the other switches are all turned off. At this time, only the second differential pair (MN33, MN34) is supplied with a drive current. Confirmation of the operation of the current source MN2 and the transistor MN22 can be conducted by comparing the values of the differential output signals (OUTT, OUTB) with expected values.

[9] When (PICT0, PICT1, PICT2, PICT3)=(0, 0, 0, 0) and (PICB0, PICB1, PICB2, PICB3)=(0, 0, 1, 0), the transistor MN23 of the third switch pair is turned on while the other switches are all turned off. At this time, only the second differential pair (MN33, MN34) is supplied with a drive current. Confirmation of the operation of the current source MN3 and the transistor MN23 can be conducted by comparing the values of the differential output signals (OUTT, OUTB) with expected values.

[10] When (PICT0, PICT1, PICT2, PICT3)=(0, 0, 0, 0) and (PICB0, PICB1, PICB2, PICB3)=(0, 0, 0, 1), the transistor MN24 of the fourth switch pair is turned on while the other switches are all turned off. At this time, only the second differential pair (MN33, MN34) is supplied with a drive current. Confirmation of the operation of the current source MN4 and the transistor MN24 can be conducted by comparing the values of the differential output signals (OUTT, OUTB) with expected values.

[11] When (PICT0, PICT1, PICT2, PICT3)=(0, 0, 0, 0) and (PICB0, PICB1, PICB2, PICB3)=(0, 0, 0, 0), all the first to fourth switch pairs are turned off. The first and second differential pairs (MN31, MN32), (MN33, MN34) are supplied with no drive currents, so that they are in an inactive state. The differential output signals (OUTT, OUTB) are in phase and in a high level (power source potential Vdd), so that confirmation of the operation of the current sources MN1 to MN4, switch MN11 to 14; MN21 to 24 can be conducted. When the switch MN11 and the like are short-circuited, the differential signals are output. Therefore, failure can be detected by comparing the output signals with expected values by a functional test.

In the above-mentioned states [3] through [10], the values of the drive currents which are supplied to the first differential pair (MN31, MN32) and the second differential pair (MN33, MN34) is ¼ of the current supplied in normal operation. The amplitude of the output wave shape is ¼ of that in normal operation. In other words, the first to fourth switch pairs function as differential switches in normal operation as mentioned above. The sum of the drive currents which are supplied to the first differential pair (MN31, MN32) and the second differential pair (MN33, MN34) is a sum of the currents through the current sources MN1, MN2, MN3, MN4. On the other hand, in the states [3] through [10], the first differential pair (MN31, MN32) and the second differential pair (MN33, MN34) are driven by a current from one selected current source, respectively.

Hence, in order to increase the output amplitude in test in the present embodiment, control may be carried out to increase the current amount of the current source I1 which supplies a reference current of a current mirror to, e.g., four times and the like.

In the present embodiment of the present invention, failure of transistors of the current sources can be detected by controlling the turning on or off of transistors of a plurality of switch pairs independently of each other with control signal PICT [3:0] and PICB [3:0] to conduct a functional test in which the output signals of the phase interpolator with logical values of expected values. In the functional test, comparing timing of the comparator (strobe positions) in test cycle is not strictly specified. "Loose functional test" in which logical levels of output signals are compared at a low test rate is conducted.

In case of comparison shown in FIG. 4, the currents from the current sources can be measured. However, an extended period of time is taken to conduct measurement of current with current meters through setting of measuring range, switching of relays, stabilization of output signals (WAIT time) and the like.

In contrast to this, in accordance with the present embodiment, false patterns are provided on the tester side for the control signals PICT [3:0] and PICB [3:0] and expected values of the output signals are provided corresponding to the false patterns. Thus, the operation of respective current paths can be confirmed in the functional test. It is of course that an AC parametric test may be conducted by a margin test and the like in which the comparing timing of the comparator in the functional test is swept.

Figure 5A:
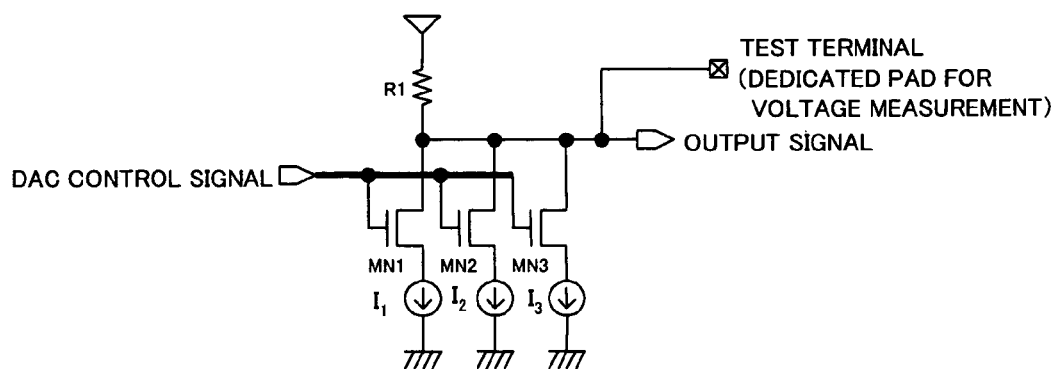
FIG. 5A shows the configuration of typical example of D/A C and FIG. 5B is a view showing the configuration including a test circuit.

Another embodiment of the present invention will now be described. FIG. 5A is a view showing an example of typical D/A converter (D/A C). Although 3-bit D/A C is shown for simplification in FIGS. 5A and 5B, it is to be noted that the present invention is not limited to 3-bit D/A C. As shown in FIG. 5A, the D/A C comprises 3 NMOS transistors MN1, MN2, MN3 having their sources which are connected to constant current sources I1, I2, I3, their drains which are commonly connected to one end of a resistor R1, and their gates to which a 3-bit D/A C control signal (input digital signal) line is connected. An output signal is output from common drains of NMOS transistors MN1, MN2, MN3. The common drains of NMOS transistors MN1, MN2, MN3 are connected to a dedicated terminal (dedicated pad) for measuring of currents of the constant current sources I1, I2, I3, which may be weighed at, for example, 1:2:4. In a normal operation, the transistors MN1, MN2, MN3 are controlled to turn on or off with the D/A C control signal (input digital signal). The current are caused to flow from the constant current source that is connected to a transistor which is turned on. A voltage which is obtained by subtracting a voltage drop due to a sum of currents flowing through the resistor R1 (a sum of currents of the constant current sources connected to the turned-on transistors of the transistors MN1, MN2, MN3 of the constant current sources I1, I2, I3) from a power source potential is output as an output analog voltage. On test of D/A C of FIG. 5A, measurement of a voltage output from a test terminal (analog voltage measurement) is conducted by turning on or off the transistors MN1, MN2, MN3.

Figure 5B:
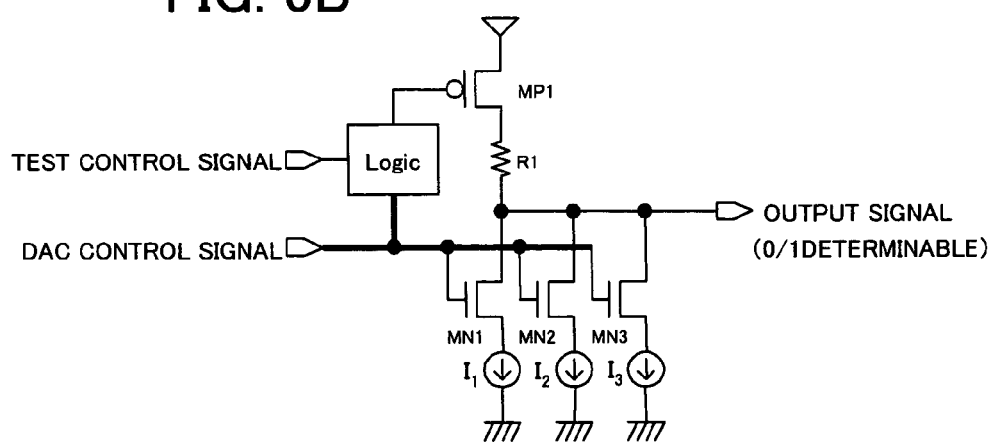

FIG. 5B is a view showing the configuration of one embodiment of a D/A C of the present invention. Referring now to FIG. 5B, the D/A C comprises a PMOS transistor MP1 between the resistor R1 and the power source in addition to the configuration of FIG. 5A. A logic circuit (Logic) is provided in which turning on or off of the PMOS transistor MP1 is controlled by inputting a test control signal and 3-bit D/A C control signal (input digital signal) for test and controlling of normal operation, respectively, to control the gate potential of PMOS transistor MP1. As shown in FIG. 5B, the test terminal (pad) of FIG. 5A is eliminated in the present embodiment.

In D/A C of FIG. 5B, the logic circuit (Logic) brings the gate potential of PMOS transistor MP1 into LOW level and turns PMOS transistor MP1 on when the test control signal shows the normal operation mode. The logic circuit functions similarly to D/A C of FIG. 5(A).

When the test control signal shows a test mode, the logic circuit (Logic) controls turning-on or off of PMOS transistor MP1 in response to values of 3-bit D/A C control signal (input digital signal) so that the output signal assumes HIGH level (power source potential) and LOW level (GND potential). For example, when all transistors MN1, MN2, MN3 are turned off by the preset value of D/A C control signal, the output signal assumes HIGH level (power source potential) by turning PMOS transistor MP1 on. The fact that the output signal is at HIGH level (expected value) is confirmed by a tester (not shown). When the transistors MN1, MN2, MN3 are defective, the output signal does not match expected value, so that failure can be confirmed.

When at least one of the transistors MN1, MN2, MN3 is turned on by preset value of D/A C control signal, the output signal having LOW level (GND potential) is output by turning PMOS transistor MP1 off, so that the fact that the output signal is in LOW level is confirmed. If the transistor which is set to turn on by the D/A C control signal is not turned on, the output signal do not assume LOW level (GND potential), so that failure can be confirmed.

If test items of a device include measurement of current and voltage in the above-mentioned embodiment, it is of course that the output terminal of the present apparatus may be also used as test terminal. If the value of the current of the current source is measured by using a current meter of a tester in the embodiment shown in FIG. 1, the output terminal also functions as test terminal shown in FIG. 4. Basically, confirmation of the operation of the transistor in a current path is conducted in the functional test to determine pass/fail. If DC measurement (current measurement) is essential in a test flows, current measurement is conducted at the test terminal of FIG. 4. The configuration of FIG. 5B may include the test terminal of FIG. 5A.

Although a semiconductor device of the present invention has been described with reference to a phase interpolator and D/A C, the present invention is not limited to the phase interpolator and D/A C. Although the present invention has been described with reference to the above-mentioned embodiment, the present invention is not limited to the configuration of the above-mentioned embodiment. It is to be understood that various modifications and changes can be made by those skilled in the art without departure of the scope and spirit of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device wherein:
   each of a plurality of current paths comprises a plurality of switching elements which control turning on or off of a current in response to input digital signals, so that a signal or signals corresponding to a sum of currents flowing through said turned-on current paths is/are output from an output terminal or terminals;
   said plurality of switching elements are controllable to turn on or off independently of each other in response to said input digital signals; and
   during testing, operation of said current paths can be confirmed by a functional test through controlling turning-on or off of said switching elements with said input digital signals to output logical signals from said output terminal or terminals, and comparing said logical signals with expected value to determine matching therebetween.

2. A semiconductor device comprising:
   a first differential pair to which a first input signal or signals is/are input as a differential input;
   a second differential pair to which a second input signal or signals is/are input as a differential input;
   a load circuit;
   a first to N-th (N is a positive integer larger than one) current sources; and
   a first to N-th switch pairs, each having a pair of switches;
   wherein output pair of each of said first and second differential pairs are commonly connected to each other at one end and are connected at the other end to said load circuit, at least one of said commonly connected output pairs being connected to an output terminal or terminals;
   the switches on one side of said first to N-th switch pairs are connected at one end thereof to said first to N-th current sources, respectively, and are commonly connected at the other end thereof to said first differential pair;
   the switches on the other side of said first to N-th switch pairs are connected at one end thereof to said first to N-th current sources, respectively, and are commonly connected at the other end thereof to said second differential pair; and
   2N control signals having values which can be individually presettable are supplied to control terminals of said first to N-th switch pairs.

3. A semiconductor device as defined in claim 2 wherein operation of at least one among said current sources, said first and second differential pairs and said first to N-th switch pairs to be tested can be confirmed during testing by a functional test in which it is determined whether or not at least one output signal from said output terminal or terminals matches or match with expected value or values.

4. A semiconductor device as defined in claim 2 wherein each switch pair of said first to N-th switch pairs is set by said control signals so that one switch is turned on while the other switch is turned off.

5. A semiconductor device as defined in claim 2 wherein a connection node with said load circuit and a common connection node of output pairs of said first and second differential pairs is/are both connected to a differential output terminal.

6. A semiconductor device as defined in claim 2 wherein an output signal having a phase which is obtained by proportionally dividing the phase difference between said first and second input signals at a proportional ratio which is defined by said control signals is output from said output terminal.

7. A semiconductor device wherein:
   said device comprises:
   a plurality of current sources which are controlled to turn on or off in response to input digital signals and have their outputs which are commonly connected to each other;
   a resistor and switch element which are in series connected between said commonly connected outputs of said plurality of current sources and a first power source; and
   a logical circuit to which a test control signal for controlling test/normal modes of operation and said input digital signal are input to control the turning-on or off of said switch; wherein
   said commonly connected outputs of said plurality of current sources are connected to an output terminal;
   on testing said logical circuit controls the turning-on or off of said switch element in response to a value of said input digital signal to output a signal having a logical level as an output signal, so that operation of said current sources can be confirmed by a functional test.

8. A semiconductor device as defined in claim 7 wherein each of said plurality of current sources comprises a serial circuit of a switch which is turned on or off in response to said input digital signal and a constant current sources between said output terminal and a second power supply.

9. A semiconductor device as defined in claim 7 wherein in normal operation, said logical circuit turns said switch on, so that a signal having a level corresponding to said input digital signal is output from said output terminal.

10. A method of testing a semiconductor device comprising:

(a) providing a semiconductor device which comprises:

a first differential pair to which a first input signal or signals is/are input as a differential input;

a second differential pair to which a second input signal or signals is/are input as a differential input;

a load circuit;

a first to N-th (N is a positive integer larger than one) current sources; and a first to N-th switch pairs, each having a pair of switches;

wherein output pair of each of said first and second differential pairs are commonly connected to each other at one end and are connected at the other end to said load circuit, at least one of said commonly connected output pairs being connected to an output terminal or terminals;

the switches on one side of said first to N-th switch pairs are connected at one end thereof to said first to N-th current sources, respectively, and are commonly connected at the other end thereof to said first differential pair;

the switches on the other side of said first to N-th switch pairs are connected at one end thereof to said first to N-th current sources, respectively, and are commonly connected at the other end thereof to said second differential pair; and 2N control signals having values which can be individually presettable are supplied to control terminals of said first to N-th switch pairs;

(b) a functional test step at which an application pattern is applied to control terminals of said first to N-th switch pairs from a test device on test by said 2N control signals, to determine whether the output signals from said output terminals match with expected value or values; and (c) confirming operation of at least one of said current sources, said first and second differential pairs and said first to N-th switch pairs to be tested by the functional test.

\* \* \* \* \*